United States Patent
Ryu

(10) Patent No.: US 6,383,838 B2
(45) Date of Patent: May 7, 2002

(54) SUBSTRATELESS CHIP SCALE PACKAGE AND METHOD OF MAKING SAME

(75) Inventor: Ju Hyun Ryu, Asan (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/892,151

(22) Filed: Jun. 26, 2001

Related U.S. Application Data

(62) Division of application No. 09/479,602, filed on Jan. 7, 2000, now Pat. No. 6,278,177.

(30) Foreign Application Priority Data

Jul. 9, 1999 (KR) .............................. 99-27689

(51) Int. Cl.[7] ......................... H01L 21/44; H01L 21/48; H01L 21/50

(52) U.S. Cl. ..................... 438/106; 438/118; 438/127

(58) Field of Search ................................ 438/106, 118, 438/127

(56) References Cited

U.S. PATENT DOCUMENTS

| | | | |
|---|---|---|---|
| 6,117,706 A | * | 9/2000 | Yoshioka et al. |
| 6,190,943 B1 | * | 2/2001 | Lee et al. |
| 6,235,552 B1 | * | 5/2001 | Kwon et al. |
| 6,323,058 B1 | * | 11/2001 | Murakamz et al. |

* cited by examiner

Primary Examiner—Charles Bowers
Assistant Examiner—Josetta I. Jones
(74) Attorney, Agent, or Firm—Mills & Onello LLP

(57) ABSTRACT

The present invention relates to a chip scale package and a method for providing the same. The chip scale package reduces the length of interconnection through the direct contact of a semiconductor chip and output terminals without a substrate. The chip scale package includes a semiconductor chip in which electronic circuits are integrated, having several bonding pads on an upper side. Output terminals are disposed around the semiconductor chip. Bonding wires connect the bonding pads with the output terminals. The bonding wires and associated components are encapsulated by a molded material, which does not encapsulate the central base of the semiconductor chip and the output terminals.

16 Claims, 3 Drawing Sheets

SUBSTRATELESS CHIP SCALE PACKAGE AND METHOD OF MAKING SAME

RELATED APPLICATIONS

This is a divisional of U.S. application Ser. No. 09/479,602, filed on Jan. 7, 2000, is now U.S. Pat. No. 6,278,177, the contents of which are incorporated herein in their entirety by reference.

BACKGROUND OF INVENTION

1. Field of the Invention

The present invention relates to a chip scale package (CSP) and, more particularly, to a substrate less chip scale package and a method of making the same.

2. Description of the Prior Art

Generally, a semiconductor package can be classified as one of several types, including a resin sealing package, a tape carrier package (TCP), a glass-sealing package, a metal sealing package, etc. Also, each type of package can be classified according to whether it uses insertion technology or surface mount technology (SMT) as its mounting method.

Typical types of packages using insertion technology include a dual in-line package (DIP), a pin grid array (PGA), etc. Typical surface mount packages include a quad flat package (QFP), a plastic leaded chip carrier (PLCC), a ceramic leadless chip carrier (CLCC), a ball grid array (BGA), a CSP etc.

Currently, because of miniaturization of electronic devices, semiconductor packages using surface mount technology are more widely used than insertion technology, because they can be more reliably mounted on printed circuit boards (PCB).

A conventional quad flat package (QFP) using surface mount technology will be described with reference to FIG. 1, which includes a schematic cross-sectional view of the structure of a typical QFP semiconductor package. This structure comprises a semiconductor chip 11 in which electronic circuits are integrated. The chip 11 is attached to a mounting board 15 by an epoxy 16. Bonding wires 13 electrically connect the semiconductor chip 11 to leads or output terminals 12. A resin molding package 14 encapsulates the semiconductor chip 11 and the other elements to protect them from the external environment including possible combustion and corrosion.

In the conventional QFP having this structure, signals to and from the semiconductor chip 11 are transmitted to and from the leads 12 through the bonding wires 13. The signals are to elements mounted, for example, on a printed circuit board or mother board via the leads 12, which are connected to the circuit board.

In the QFP, the number of pins in the package gradually increases with increased integration of the semiconductor chip 11. However, there are physical limitations on the amount the distance between pins can be reduced. As a result, the package must be made large enough to accommodate the required number of pins. Given the recent trend toward miniaturization and high density of semiconductor devices, the resulting higher pin count calls for larger and larger package sizes, thus tending to defeat the purpose of achieving smaller devices.

Ball grid array (BGA) packages and chip scale packages (CSP) have been suggested to solve the problem. The BGA and CSP packages use a solder ball placed on one side of the semiconductor package as an input and output means and forms a package the same size as the semiconductor chip, which makes the package light, thin, simple and small. The CSP package has applicability in many areas.

FIG. 2 illustrates the structure of a BGA-type CSP comprising circuit patterns 25a formed on both sides thereof. The circuit substrate 25 is shown coated with solder masks 25b for protecting the circuit patterns 25a. A semiconductor chip 21 is attached on the center of the circuit substrate 25. Wires 23 electrically connect the semiconductor chip 21 to the circuit patterns 25a of the circuit substrate 25 and transfer signals therebetween. Solder balls 22 serve as the output terminals fused on the circuit patterns 25a of the circuit substrate 25 to the signals in and out of the circuit. A resin package encapsulating the semiconductor chip 21 and its peripherals protects them from the external environment.

In the CSP structure, signals from the semiconductor chip 21 are transmitted to the substrate 25 via the wires 23. The signals pass through the circuit patterns 25a in the back side and are transmitted to the peripheral elements through the solder balls 22 which are the output terminals. Signals from the peripheral elements are transmitted to the semiconductor chip 11 in reverse fashion.

As described above, the conventional CSP fixes the semiconductor chip 21 by using the substrate 25 as a PCB or a ceramic substrate. The front side of the substrate 25 and the semiconductor chip are connected by the wires 23, and the back side of the substrate 25 and the output terminals of the package are connected by the circuit patterns 25a. This type of structure has certain drawbacks including long interconnection delays in the time of transmitting signals. Also, it is difficult to accurately achieve certain device performance characteristics since the circuit patterns 25a are formed on the front and back side of the substrate 25 and are connected to each other.

Also, it is difficult to produce a highly reliable CSP because of the adhesive force between a conventional PCB used as a substrate and the resin package, the difference of coefficient of thermal expansion between them, the flaking of the resin package over temperature ranges and cracking occurring due to introduction of moisture into the substrate.

SUMMARY OF THE INVENTION

It is one object of the present invention to provide a chip scale package (CSP) in which a semiconductor chip is connected directly to output terminals of the package without a substrate to reduce the length of interconnection, to miniaturize the package and to remove the defects generated by a substrate.

It is another object of the present invention to provide a method of making a CSP having no substrate.

In one aspect, the present invention is directed to a substrateless chip scale package. Electronic circuits of the device are integrated on a semiconductor chip in the package. The chip includes one or more bonding pads on its upper side. A plurality of output terminals are disposed around an edge of a lower side of the semiconductor chip in a plane which is below the lower side of the semiconductor chip. A plurality of bonding wires electrically connect a plurality of the bonding pads with corresponding output terminals of the device. A molded material encapsulates the bonding wires and associated elements and does not encapsulate a central portion of the lower side of the semiconductor chip and the lower side of a plurality of the output terminals.

In another aspect, the present invention is directed to a method for providing a chip scale package having no substrate. In accordance with this aspect, several output terminals are arranged on a tape film. A semiconductor chip having circuits integrated therein is attached and fixed on the center of the tape film, on which output terminals are arranged using a bonding means attached on the same level with the output terminals. Bonding pads formed on the upper side of the semiconductor chip are electrically connected to the output terminals by bonding wires. A molded material is formed to at least partially encapsulate the bonding wires. The output means is exposed by removing the tape film and the bonding means.

In one embodiment, the output terminals are made of a conductive metal which can be copper (Cu), gold (Au), titanium (Ti), palladium (Pd), silver (Ag) or an alloy thereof. The tape film can be made of a sheet-type metal foil or polyimide. The bonding means can be made of a silver paste, a bonding agent of sheet-type silicon or an elastomer.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
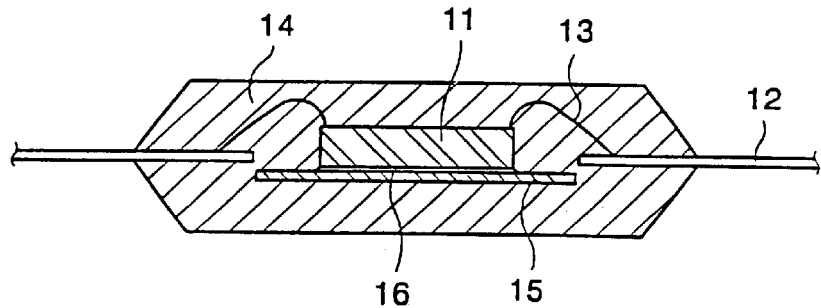
FIG. 1 is a schematic cross-sectional view illustrating the structure of a conventional semiconductor package.
Figure 2:
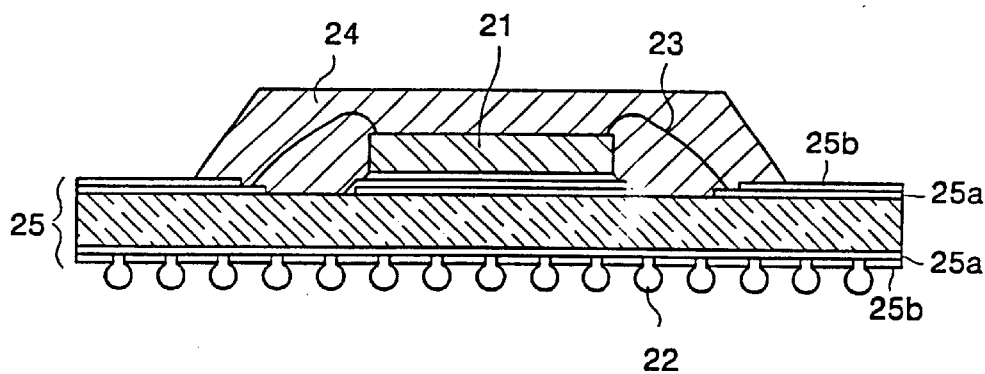
FIG. 2 is a schematic cross-sectional view illustrating the structure of a chip scale package according to the prior art.
Figure 3:
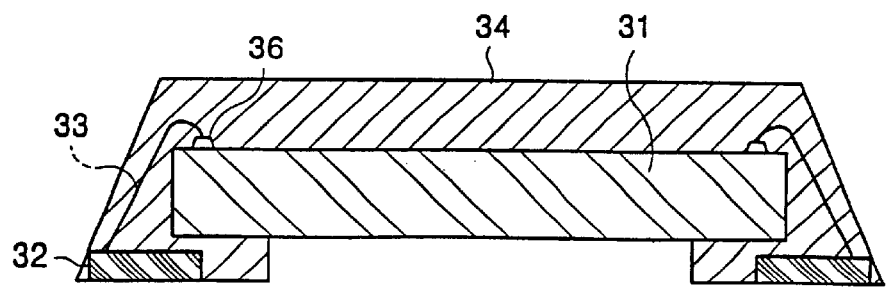
FIG. 3 is a schematic cross-sectional view illustrating the structure of a chip scale package according to one embodiment of the present invention.

FIG. 3 illustrates the structure of a chip scale package having no substrate according to one embodiment of the present invention. Referring to FIG. 3, a semiconductor chip 31 is connected directly to output terminals 32 by bonding wires 33, without being connected to or through a substrate. The semiconductor chip 31 includes electronic integrated circuits, and several bonding pads 36 are formed on both sides of the semiconductor chip 31. One end of each bonding wire 33 is connected to a bonding pad 36 of the semiconductor chip 31, and the other end is connected to an output terminal 32.

One end of each output terminal 32 is in contact with the semiconductor chip 31 through a bonding wire 33, and the other end is exposed externally to provide for external connections to the device to transmit signals to and from the semiconductor chip. The output terminals 32 are made of a conductive metal such as, for example, Cu, Au, Ti, Pd, Ag or an alloy thereof. Also, in order to improve the conductivity, these conductive metals can be coated with nickel or gold.

A solid molded material 34 encapsulates the semiconductor chip 31, the bonding pads 36 and the bonding wires 33 to protect them from environmental factors. The molded material 34 can be, for example, an epoxy molding compound, for example, an ultraviolet-setting epoxy resin, a thermosetting epoxy resin, a thermoplastic epoxy resin or a silicon resin.

Hence, according to one embodiment of the present invention, the chip scale package (CSP) of the invention includes a semiconductor chip 31 composed of integrated circuits (IC) and connected directly to the output terminals by bonding wires. It does not include a circuit pattern such as those found in conventional devices. As a result, the length of interconnection between circuits on the chip and external devices is shorter. Accordingly, the device exhibits greatly improved operational characteristics due to the reduction in transmission or propagation time of the signals. Also, the package is more reliable than conventional devices because it does not require an expensive circuit substrate.

Figure 4A:
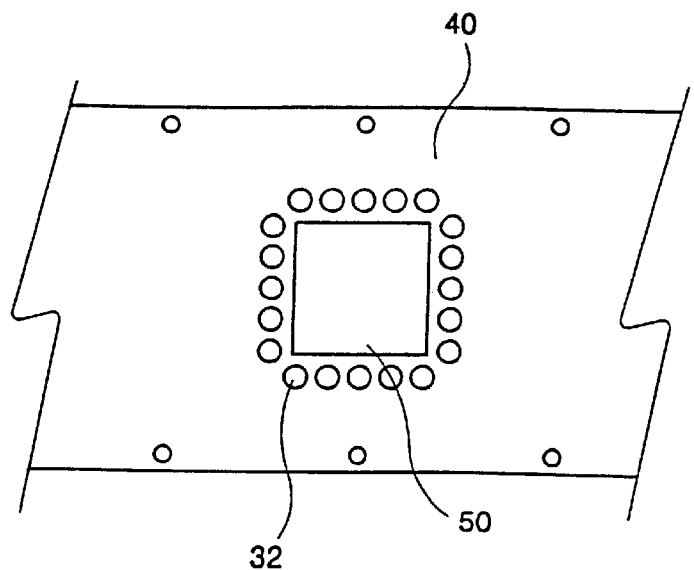
FIGS. 4a to 4f contain schematic sectional views illustrating formation of a chip scale package according to one embodiment of the present invention.

FIGS. 4a–4f contain a series of schematic cross-sectional drawings which illustrate formation of a chip scale package according to one embodiment of the present invention. Referring to FIG. 4a, several output terminals 32 of an oval or square shape are primarily arranged on a tape film 40. A bonding means 50 in which the semiconductor chip will be placed is attached on the center of the tape film at the same level with and at a predetermined spacing with the output terminals 32. In one embodiment, the tape film 40 is a polyimide tape or a sheet-type metal foil, and the bonding means 50 is a silver (Ag) paste, a bonding agent of a sheet-type silicon or an elastomer.

Figure 4B:
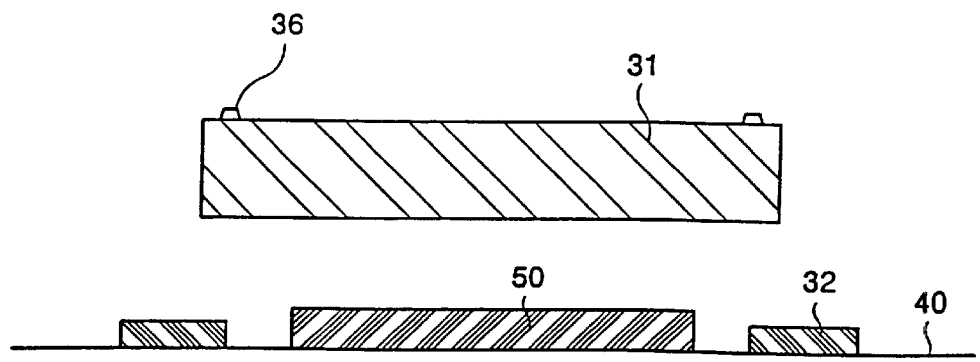

As shown in FIG. 4b, the semiconductor chip or "die" 31, including integrated circuits, is attached by the bonding agent 50 to the center of the tape film 40 on which the output terminals 32 are arranged.

Figure 4C:
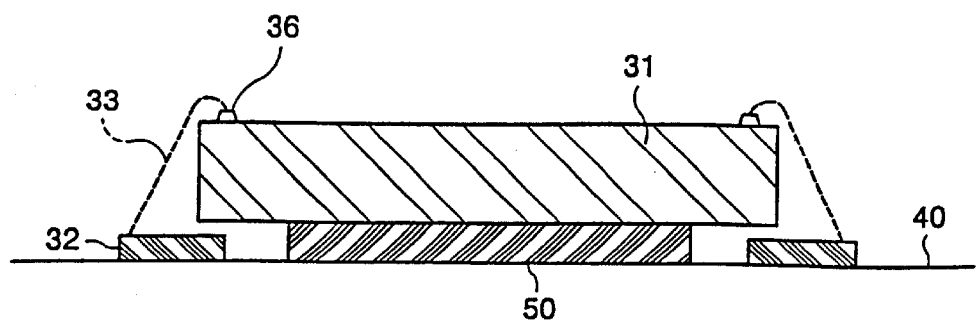

Referring to FIG. 4c, after the semiconductor chip 31 is attached as shown in FIG. 4b, several bonding pads 36 formed on the semiconductor chip 31 are connected to the output terminals 32 by bonding wires 33.

Figure 4D:
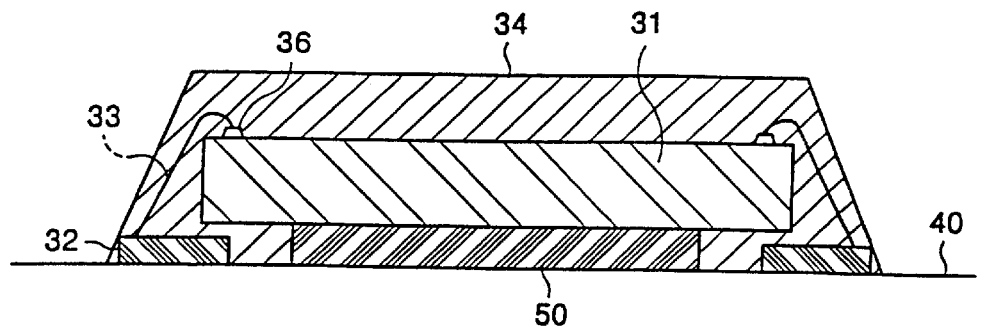

Referring to FIG. 4d, after the wire-bonding process, a molded material outer package 34 is formed using, for example, an epoxy molding compound (EMC) to protect the semiconductor chip 31 and the bonding wires 33 from exposure to the outside environment. A method of dispensing a liquid epoxy can be used instead of the molding method using the epoxy molding compound 34.

Figure 4E:
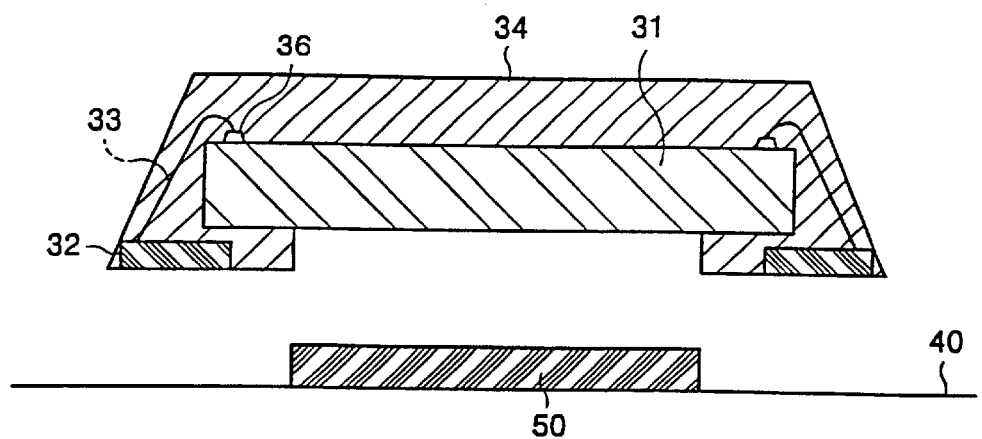

As shown in FIG. 4e, the output terminals 32 are exposed by removing the tape film 40 and the bonding agent 50 at the same time.

Figure 4F:
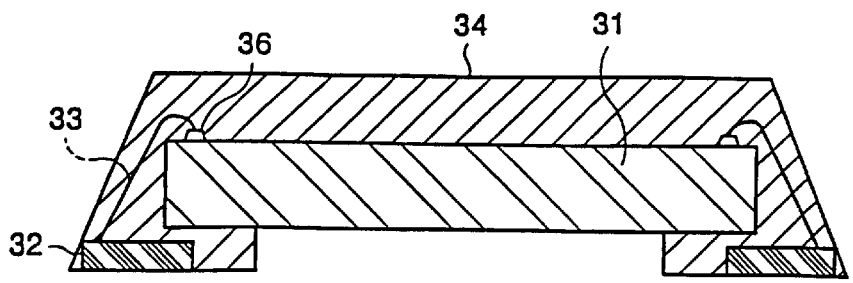

Ultraviolet radiation, heat treatment or chemical etching can be performed to facilitate removal of the bonding means 50 by weakening the adhesive force between the tape film 40 and the bonding means 50. Accordingly, the chip scale package having no substrate is completed as shown in FIG. 4f.

Thus, as described above, the present invention provides a chip scale package with no need for a substrate by arranging the output terminals 32 on the tape film 40, fixing the semiconductor chip 31 to the tape film 40 using the bonding agent 50, connecting the bonding pads 36 of the chip 31 to the output terminals 32 with the bonding wires 33, molding the package with the epoxy resin, and removing the tape film.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A method for providing a chip scale package having no substrate, comprising:

arranging a plurality of output terminals on a tape film using a bonding means attached on the same side of the tape film as the output terminals;

attaching a semiconductor chip having at least one integrated circuit;

connecting bonding pads formed on an upper side of said semiconductor chip to said output terminals using bonding wires;

molding a package to at least partially encapsulate the semiconductor chip and the bonding wires; and exposing said output means by removing said tape film and said bonding means.

2. The method as claimed in claim 1, wherein said output terminals are made of a conductive metal selected from the group of Cu, Au, Ti, Pd, Ag and an alloy thereof.

3. The method as claimed in claim 1, wherein said tape film is a sheet-type metal foil.

4. The method as claimed in claim 1, wherein said tape film is a polyimide film.

5. The method as claimed in claim 1, wherein said bonding means comprises an Ag paste.

6. The method as claimed in claim 1, wherein said bonding means comprises a bonding agent of a sheet-type silicon.

7. The method as claimed in claim 1, wherein said bonding means comprises an elastomer.

8. The method as claimed in claim 1, wherein said molding means comprises an ultraviolet-setting epoxy resin.

9. The method as claimed in claim 1, wherein said molding means comprises a thermosetting epoxy resin.

10. The method as claimed in claim 1, wherein said molding means comprises a thermoplastic epoxy resin.

11. The method as claimed in claim 1, wherein said molding means comprises a silicon resin.

12. The method as claimed in claim 1, wherein the molding step comprises dispensing a liquid epoxy.

13. The method as claimed in claim 1, further comprising radiating with ultraviolet rays to remove said tape film.

14. The method as claimed in claim 1, further comprising heating to remove said tape film.

15. The method as claimed in claim 1, further comprising chemical etching to remove said tape film.

16. The method as claimed in claim 1, wherein said bonding pads are in direct electrical contact with the output terminals through the bonding wires.

* * * * *